US012566225B2

(12) United States Patent
Prügl et al.

(10) Patent No.: US 12,566,225 B2
(45) Date of Patent: Mar. 3, 2026

(54) SPIN VALVE DEVICE WITH PRECIOUS METAL-FREE ANTIFERROMAGNET IN STABILIZATION LAYER

(71) Applicant: Infineon Technologies AG, Neubiberg (DE)

(72) Inventors: Klemens Prügl, Regensburg (DE); Miriam Schwan, Regensburg (DE); Bernhard Endres, Nabburg (DE)

(73) Assignee: Infineon Technologies AG, Neubiberg (DE)

( * ) Notice: Subject to any disclaimer, the term of this patent is extended or adjusted under 35 U.S.C. 154(b) by 358 days.

(21) Appl. No.: 18/193,091

(22) Filed: Mar. 30, 2023

(65) Prior Publication Data

US 2023/0314534 A1 Oct. 5, 2023

(30) Foreign Application Priority Data

Mar. 31, 2022 (DE) .......................... 102022107757.8

(51) Int. Cl.
| | |
|---|---|
| *G01R 33/09* | (2006.01) |
| *G11C 11/16* | (2006.01) |
| *H01F 10/32* | (2006.01) |
| *H10N 50/01* | (2023.01) |
| *H10N 50/10* | (2023.01) |
| *H10N 50/85* | (2023.01) |

(52) U.S. Cl.
CPC .......... *G01R 33/093* (2013.01); *G11C 11/161* (2013.01); *H01F 10/3268* (2013.01); *H10N 50/01* (2023.02); *H10N 50/10* (2023.02); *H10N 50/85* (2023.02)

(58) Field of Classification Search
CPC ...... G01R 33/093; H10N 50/01; H10N 50/85; H10N 50/10; H01F 10/3268; G11C 11/161
USPC .......................................................... 257/421
See application file for complete search history.

(56) References Cited

U.S. PATENT DOCUMENTS

| | | | | |
|---|---|---|---|---|
| 5,552,949 A * | 9/1996 | Hashimoto | ............ | H10N 50/10 324/252 |
| 6,010,781 A * | 1/2000 | Aoshima | ............. | H01F 10/3268 324/252 |
| 6,639,762 B2 * | 10/2003 | Saito | ................... | H01F 10/3268 |
| 6,650,512 B1 * | 11/2003 | Gill | ..................... | H01F 10/3268 |
| 7,365,948 B2 * | 4/2008 | Nakabayashi | ........ | H01F 41/308 29/603.07 |
| 8,351,164 B2 * | 1/2013 | Fuji | ..................... | H01F 10/3254 365/158 |
| 2002/0145902 A1 * | 10/2002 | Kunikiyo | ............ | G11C 11/1675 365/97 |
| 2009/0141410 A1 * | 6/2009 | Jogo | ................... | G11B 5/3906 |

(Continued)

OTHER PUBLICATIONS

Meyer, "Chances of XMR-Sensors in Automotive Applications," Proceedings of the 11th Symposium Magnetoresistive Sensors and Magnetic Systems, Germany, 2011, 8 pages.

*Primary Examiner* — Jami Valentine Miller
(74) *Attorney, Agent, or Firm* — Harrity & Harrity, LLP

(57) ABSTRACT

A device having a spin valve layer sequence, wherein the spin valve layer sequence includes a first magnetic layer having a variable direction of magnetization, a second magnetic layer having a fixed direction of magnetization, and a stabilization layer for stabilizing the fixed direction of magnetization of the second magnetic layer, wherein the stabilization layer includes a precious metal-free antiferromagnet.

23 Claims, 3 Drawing Sheets

(56) References Cited

U.S. PATENT DOCUMENTS

| | | | | |
|---|---|---|---|---|
| 2009/0207531 A1* | 8/2009 | Shiimoto | ............... | B82Y 10/00 |
| | | | | 360/316 |
| 2014/0077319 A1* | 3/2014 | Noma | .................... | H10N 50/01 |
| | | | | 257/421 |
| 2015/0192648 A1* | 7/2015 | Campiglio | ........... | G11B 5/3932 |
| | | | | 324/252 |
| 2019/0305040 A1* | 10/2019 | Jeong | ..................... | H10B 61/00 |
| 2019/0392990 A1* | 12/2019 | Schlage | ............. | H01F 10/3268 |
| 2020/0173043 A1* | 6/2020 | Lin | ....................... | C25B 11/075 |
| 2021/0095383 A1* | 4/2021 | Lin | ....................... | C25B 11/051 |

* cited by examiner

SPIN VALVE DEVICE WITH PRECIOUS METAL-FREE ANTIFERROMAGNET IN STABILIZATION LAYER

CROSS REFERENCE TO RELATED APPLICATION

This application claims priority to German Patent Application No. 102022107757.8 filed on Mar. 31, 2022, the content of which is incorporated by reference herein in its entirety.

TECHNICAL FIELD

Various implementations relate generally to devices having a spin valve layer sequence and to a corresponding production process.

BACKGROUND

A spin valve is a technical device based on an interconnection of two (or more) conductive magnetic materials. The electrical resistance of the overall system (for example from the bottom upward) varies in a measurable order of magnitude when the relative orientation of the magnetization of magnetic layers is switched from antiparallel to parallel.

Some spin valves have a complex construction, which limits the attractiveness of the use of spin valve devices.

SUMMARY

There could be a need to provide a spin valve that can be manufactured with an acceptable level of complexity.

In an illustrative working example, an apparatus with a spin valve layer sequence is provided, wherein the spin valve layer sequence includes a first magnetic layer having a variable direction of magnetization, a second magnetic layer having a fixed direction of magnetization, and a stabilization layer for stabilizing the fixed direction of magnetization of the second magnetic layer, wherein the stabilization layer includes a precious metal-free antiferromagnet.

In another illustrative working example, an apparatus having a spin valve layer sequence is provided, wherein the spin valve layer sequence includes a stabilization layer for stabilizing a fixed direction of magnetization of a magnetic layer, and wherein the stabilization layer contains or consists of manganese nitride.

In a further illustrative working example, a method of producing an apparatus having a spin valve layer sequence is provided, wherein the method includes forming a first magnetic layer having a variable direction of magnetization, forming a second magnetic layer having a fixed direction of magnetization, and forming a stabilization layer for stabilizing the fixed direction of magnetization of the second magnetic layer, wherein the stabilization layer takes the form of a precious metal-free antiferromagnet.

An illustrative working example is provided by a spin valve layer sequence that may have a magnetic layer having a variable direction of magnetization and a further magnetic layer having a variable direction of magnetization. A stabilization layer stabilizes the fixed direction of magnetization with regard to its magnetic properties, and can advantageously be manufactured using a precious metal-free antiferromagnet. It is particularly advantageous to use manganese nitride for the precious metal-free antiferromagnet. Such a precious metal-free antiferromagnet can be formed with a very low level of production complexity, especially using sputtering using a simple manganese target. It is therefore advantageously possible to omit precious metal sources that are difficult to process, for example including iridium. In this way, it is possible to provide a device having a spin valve that can be manufactured with an acceptable level of complexity.

There follows a description of additional illustrative working examples of the devices and of the method.

In the context of this application, the expression "spin valve layer sequence" may especially be understood to mean a sequence of layers formed one on top of another and/or alongside one another, which together assume the function of a spin valve. Such a spin valve may include at least one magnetic layer with fixed magnetization and at least one magnetic layer with variable magnetization that may be switched between different states of magnetization in order to establish different magnetic states of the spin valve. The different magnetic states of the spin valve correspond to different electrical resistances of the spin valve layer sequence.

In the context of this application, the expression "magnetic layer having a variable direction of magnetization" is especially understood to mean at least one layer of a magnetic or magnetizable material which can be brought into different states of magnetization by an external magnetic field. For example, such a magnetic layer may be varied in a controlled manner with a variable, alterable or adjustable direction of magnetization, depending on the direction and/or magnitude of an external magnetic field. For example, the magnetic layer having a variable direction of magnetization may be switched between a state with magnetization parallel to the magnetic layer having a fixed direction of magnetization and another state with magnetization antiparallel to the magnetic layer with fixed magnetization. More generally, any desired angle may be possible between the variable direction of magnetization and the fixed direction of magnetization. The parallel and antiparallel configurations described are therefore mentioned merely by way of example. In a device in the form of a sensor, it is possible, for example, to read out all possible angles. For example, the magnetic layer having a variable direction of magnetization may be formed from a soft-magnetic material.

In the context of this application, the expression "magnetic layer having a fixed direction of magnetization" is especially understood to mean at least one layer of a magnetic material, the direction of magnetization of which is constant, invariable or fixed, irrespective of an external magnetic field. For example, the magnetic field having a fixed direction of magnetization may be formed from a hard-magnetic material.

In the context of this application, the expression "stabilization layer" is especially understood to mean a layer of a magnetic (especially antiferromagnetic) material that brings about, promotes and or assists the fixed direction of magnetization of the magnetic layer having a fixed direction of magnetization. In other words, the stabilization layer can contribute to avoiding or even preventing an unwanted change in the direction of magnetization of the layer having the fixed direction of magnetization. The stabilization layer may have been produced from a natural antiferromagnet.

In the context of this application, the expression "precious metal-free antiferromagnet" may especially be understood to mean an antiferromagnetic material that does not include any precious metal. The precious metal-free antiferromagnet may thus be formed by materials other than a precious metal.

Precious metals in this context may be understood to mean corrosion-resistant metals having sustained chemical stability in a natural environment under the action of oxygen and water. Examples of precious metals are gold, silver, platinum, palladium and iridium. A precious metal-free antiferromagnet may thus especially be free of gold, silver, platinum, palladium and/or iridium. A person skilled in the art will appreciate that even a precious metal-free antiferromagnet, as a result of the preparation, may include unavoidable and unintended traces of precious metals, for example in the ppm range. If such traces do not adversely affect the technical function of the stabilization layer, regardless of such traces, an antiferromagnet may be referred to as precious metal-free.

In the context of this application, the expression "manganese nitride" may especially be understood to mean a compound including manganese and nitrogen. Manganese nitride may be described as $Mn_yN_z$. The manganese nitride used should be present in one or more antiferromagnetic phases. Traces or small amounts of manganese nitride may also be present in other phases, provided that the manganese nitride has antiferromagnetic properties overall. In one working example, the antiferromagnetic manganese nitride may be in the $Mn_6N_{5+x}$ form, and where x is within a range from 0 to 1, especially within a range from 0.05 to 0.35. For example, it may be the case that x=0.18. The exact value of x may be selected by adjusting the process parameters of a deposition method for deposition of manganese nitride in the $Mn_6N_{5+x}$ form. Alternatively, or additionally, the antiferromagnetic manganese nitride may be in the $Mn_3N_2$ form.

In one working example, the precious metal-free antiferromagnet may be a nitride and/or an oxide of one or more transition metals. Transition metals are especially understood to mean metals with a part-filled 3d shell. Examples of precious metal-free antiferromagnets of the group mentioned are manganese nitride and nickel oxide.

In one working example, the stabilization layer may have a thickness within a range from 10 nm to 50 nm. The exact thickness of the stabilization layer may be adjusted based on the process parameters of a sputtering method for production thereof, and depending on process parameters of a healing method for healing or annealing of the stabilization layer after deposition thereof.

In one working example, the stabilization layer may be disposed above the second magnetic layer and above the first magnetic layer. It is thus possible to create a top spin valve. With such a top spin valve geometry, it is immaterial for the quality of the layer sequence when a manganese nitride stabilization layer is formed with relatively high roughness in the sputtering operation, since the critical magnetic layers are disposed beneath such a manganese nitride stabilization layer and hence are processed beforehand. This geometry allows the stabilization layer to bring about the desired stabilization of the spatially close second magnetic layer without occurrence of restrictions of function caused by marked roughness.

In one working example, the device may have an outer layer atop the stabilization layer. This top layer may be configured to protect the stabilization layer and to ensure the function thereof regardless of ambient conditions.

In one working example, the outer layer may include a nitrogen scavenger material. When the stabilization layer is formed from a nitride of a transition metal, especially manganese nitride, there may, for example, be unwanted migration of nitrogen through the layer sequence in an annealing method (preferably at elevated temperature and in the presence of a magnetic field) after the deposition of the stabilization layer. Nitrogen may also get into layers, the functioning of which is adversely affected by migrating nitrogen. One example is a tunnel layer of magnesium oxide in a TMR (tunneling magneto resistance) layer sequence. If a nitrogen scavenger material configured to trap migrating nitrogen is embedded into the outer layer, this material can trap migrating nitrogen and hence keep it away from other layers (especially from a tunnel layer).

In one working example, the nitrogen scavenger material may be elemental tantalum and/or elemental titanium. By way of illustration, incorporation of metallic tantalum or titanium into the outer layer results in binding of migrating nitrogen, which creates tantalum nitride or titanium nitride. Other nitrogen-sensitive layers of the layer sequence may thus be protected from the unwanted influence of nitrogen.

In one working example, the outer layer may include an antioxidation material. Such an antioxidation material may protect the magnetization layers, and especially the second magnetization layer, from unwanted corrosion or oxidation by surrounding moisture or ambient oxygen.

If the transition metal-free antiferromagnet is a nitride of a transition metal (for example manganese nitride), the outer layer should include the nitrogen scavenger material (preferably elemental tantalum and/or elemental titanium) and additionally an antioxidation material. If, by contrast, the precious metal-free antiferromagnet is an oxide of a transition metal (for example nickel oxide), the outer layer may also be formed solely from an antioxidation material.

In one working example, the outer layer may have a thickness within a range from 5 nm to 100 nm. The thickness of the outer layer may especially be chosen depending on whether a nitrogen scavenger material is to be integrated into it and/or how corrosion-prone or oxidation-sensitive the materials of the layer sequence beneath the outer layer are.

In one working example, the device may include an electrically insulating tunnel layer between the first magnetic layer and the second magnetic layer. For example, such a dielectric tunnel layer may be formed from magnesium oxide. By way of illustration, in a TMR spin valve, electrical charge carriers can tunnel through the electrically insulating tunnel layer.

Alternatively, the device may have an electrically conductive current conduction layer between the first magnetic layer and the second magnetic layer. For example, such a current conduction layer for conduction of electrical current in operation of the device may be formed from copper. By way of illustration, in a GMR (giant magneto resistance) spin valve, electrical charges may be electrically conducted by the current conduction layer.

In one working example, the second magnetic layer may have two ferromagnetic sublayers, between which is disposed a coupling layer for antiferromagnetic coupling of the two ferromagnetic sublayers. The arrangement composed of the two magnetic sublayers and the coupling layer disposed in between may also be referred to as an artificial antiferromagnet. For example, each of the ferromagnetic sublayers may include cobalt-iron (CoFe), and the coupling layer ruthenium or iridium. By virtue of such a configuration, the ruthenium may bring about antiparallel spin coupling between the two ferromagnetic sublayers, which leads to a firmly or fixedly magnetized second magnetic layer overall. As an alternative to ruthenium, for example, it is also possible to use iridium to form the coupling layer. The material used for the ferromagnetic sublayers may alternatively also be CoFeB or a mixture of CoFe and CoFeB.

In one working example, the first magnetic layer may be a soft-magnetic layer. A monolayer of cobalt-iron (CoFe)

may lead to these properties. By way of illustration, it is possible to transmagnetize a soft-magnetic layer with low magnetic energy. This permits high sensitivity of a device in the form of a sensor or a writing energy in a device in the form of a data storage medium.

In one working example, the spin valve layer sequence may be an XMR layer sequence. More generally, the spin valve layer sequence may be a sequence of layers that show a magnetoresistive effect in combination. An XMR layer sequence may be referred to as a thin-layer structure that can change its electrical resistance under the influence of a magnetic flux.

It is possible that the XMR layer sequence has a GMR (giant magneto resistance) layer sequence. A GMR layer sequence has the property of a particularly large difference in resistance in different states of magnetization and is based on a magnetoresistive effect. In a GMR layer sequence, the variable electrical resistance may be an ohmic resistance. The effect of the GMR effect is that the electrical resistance of the structure depends on the mutual orientation of the directions of magnetization of the magnetic layers. This effect is obtained in structures formed from alternating magnetic and non-magnetic thin layers (especially with a layer thickness of a few nanometers).

The XMR layer sequence may also have a TMR (tunneling magneto resistance) layer sequence. The magnetic tunneling resistance or TMR effect is a magnetoresistive effect which is used in magnetic tunnel contacts and is part of magnetoelectronics. The TMR effect is a quantum-mechanical phenomenon. In a TMR layer sequence, the variable electrical resistance may be a tunneling resistance.

In one working example, the device may take the form of a sensor. If a magnetic field acts on the device, the magnetic field can influence the magnetization of the magnetic layer with variable magnetization in a characteristic manner, for example reverse it, whereas the magnetization of the fixed magnetic layer remains essentially unchanged. The relative orientation of the magnetizations of the magnetic layers of the spin valve layer sequence has an influence on the electrical resistance thereof. If an electrical sensing voltage is applied to the spin valve sequence, the change in magnetization of the magnetic layers can be detected based on the associated change in electrical resistance via a corresponding change in a current flow. For example, the electrical resistance of such a spin valve layer sequence can be measured conveniently using a Wheatstone bridge.

In one working example, the sensor may take the form, for example, of a magnetic sensor, of a current sensor or of a reading head. In a magnetic field sensor, the magnetic field to be detected can directly influence the direction of magnetization of the magnetic layer with variable magnetization, such that the magnetic field can be detected by measurement of the electrical resistance. In a current sensor for measuring an electrical current that flows through an electrical conductor, the magnetic field generated by the current-carrying conductor can be measured indirectly. In the case of a reading head for reading a storage medium, for example a hard drive, the magnetic field of the surface of the hard drive influences the XMR reading head, which means that the electrical resistance of the XMR reading head is a measure of the datum stored.

In one working example, the device may take the form of a data storage medium. For example, on account of the different electrical resistances of an XMR memory element with directions of magnetization of the two magnetic layers oriented parallel or antiparallel to one another in a device in the form of a data storage medium with a spin valve layer sequence, the logical information "0" or "1" may be stored.

In one working example, the method may include forming of the stabilization layer using sputtering. Sputtering (also referred to as cathode atomization) is a physical operation in which atoms are isolated from a solid-state body (which may be referred to as target) by bombardment with high-energy ions (especially noble gas ions) and can be converted to the gas phase. Using sputtering, it is possible to deposit the stabilization layer with the above-described features in a particularly simple manner, by using a precious metal-free target.

In one working example, the method may include sputtering using a target made of a transition metal, especially of manganese. Advantageously, a precious metal target therefore may be dispensable, being very costly and therefore increasing the cost of production. It is possible, for example, to use a much less costly manganese target or nickel target. Surprisingly, it is possible with an antiferromagnet in the form of manganese nitrides to achieve essentially the same performance as in the case of spin valves comprising PtMn or IrMn. However, the stabilization layer can also be generated by different deposition methods than by sputtering.

In one working example, the method may include sputtering in a nitrogen-containing or oxygen-containing atmosphere. In this way, it is possible to provide nitrogen (or alternatively oxygen) in order to use a transition metal such as manganese (or alternatively nickel) to form a precious metal-free antiferromagnet, such as manganese nitride (or nickel oxide). For this purpose, it is sufficient to supply a noble gas atmosphere in a sputtering system with a nitrogen component (for example an oxygen component), which is possible with a degree of complexity.

In one working example, the method may include healing (also referred to as annealing) of the stabilization layer that has been formed by sputtering for example. A healing process can precisely adjust the desired magnetic properties of the stabilization layer, especially in relation to the second magnetic layer. This can improve the reproducibility of the spin valve layer sequence produce.

In one working example, the annealing may include heating of the stabilization layer and subsequent cooling of the stabilization layer in an external magnetic field. This process regime, by way of illustration, allows the magnetization in the spin valve layer sequence to be frozen. The heating can be effected, for example, to a maximum temperature within a range from 240° C. to 400° C., for example to 300° C. The external magnetic field may be provided, for example, by a permanent magnet or an electromagnet that can generate, for example, a magnetic field strength within a range from 0.05 tesla to 5 tesla, for example 1 tesla. In particular, the spin valve layer sequence to be healed may be cooled in such a magnetic field in order to establish the magnetization properties thereof.

BRIEF DESCRIPTION OF THE DRAWINGS

Working examples are shown in the figures and will be elucidated in detail hereinafter.

The figures show.

DETAILED DESCRIPTION

Figure 1:
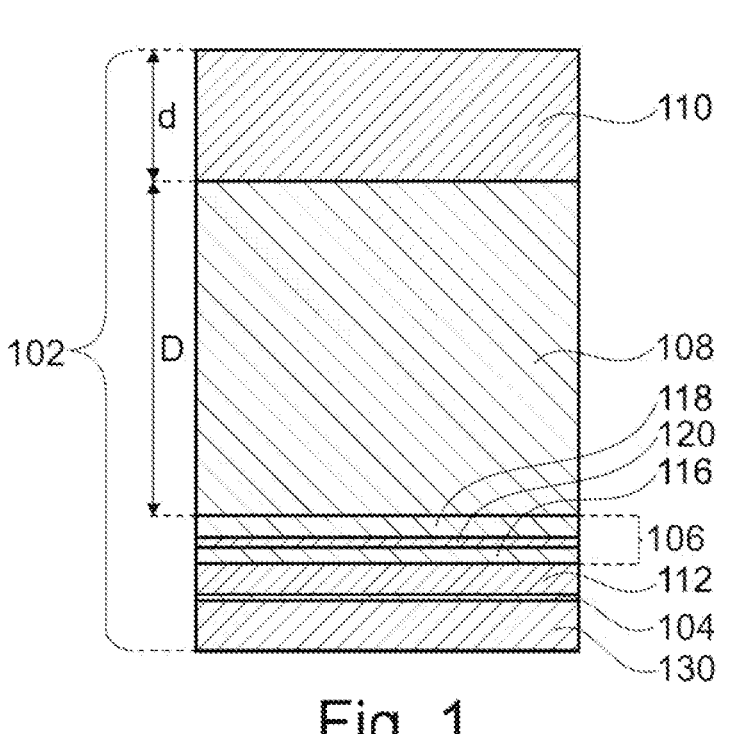
FIG. 1: a cross-sectional view of a device with a spin valve layer sequence according to an illustrative working example.

Identical or similar components in different figures are given identical reference numerals.

Before illustrative working examples are described with reference to the figures, some general considerations will be elucidated, based on which illustrative working examples were developed:

Conventional XMR sensors use a spin valve in order to detect the direction or strength of an external magnetic field. In a spin valve, a magnetic layer having a fixed direction of magnetization and a magnetic layer having a variable direction of magnetization are used. The direction of magnetization can be fixed via an exchange bias effect. For this purpose, it is possible to deposit, in a mutually adjoining manner, an antiferromagnetic layer and a ferromagnetic layer. Typical antiferromagnets used are PtMn and IrMn. Both are very costly to produce since they include precious metals (platinum/iridium).

In an illustrative working example, a spin valve layer sequence with a first magnetic layer having a variable direction of magnetization and a second magnetic layer having a fixed direction of magnetization, and a stabilization layer magnetically coupled to the second magnetic layer are provided. The latter serves to stabilize the fixed direction of magnetization and advantageously comprises a precious metal-free antiferromagnet, more preferably manganese nitride (MnN). In an illustrative manner, in one such working example of the antiferromagnetic stabilization layer, rather than PtMn or IrMn, it is possible to integrate a precious metal-free antiferromagnet, especially manganese nitride, into an XMR layer stack. It is thus possible to replace conventionally used antiferromagnetic stabilization layers of IrMn or PtMn with an antiferromagnet in the form of manganese nitride. Manganese nitride can be sputtered onto a substrate with a low degree of complexity from a manganese target in a nitrogen ($N_2$) atmosphere.

In illustrative working examples, it is thus possible to replace conventional precious metal-based materials for an antiferromagnetic stabilization layer (PtMn and IrMn) in a spin valve with magnesium.

Since manganese nitride applied by sputtering can have high roughness, it may be advantageous first to apply the first and second magnetic layers and only then the stabilization layer. A top spin valve obtained thereby features particularly good performance. In particular performance aspects (for example the GMR swing, which can be calculated as the ratio between a maximum resistance and a minimum resistance minus 1), it is superior to conventionally used materials (especially PtMn and IrMn) for an antiferromagnetic stabilization layer.

Another relevant aspect in the manufacture of an antiferromagnetic stabilization layer of manganese nitride is the phenomenon of nitrogen diffusion: during healing (annealing) of the spin valve, the nitrogen which can be used to produce manganese nitride can diffuse through active layers of the spin valve layer sequence. Under unfavorable circumstances, this can lead to impairment of the functionality of the spin valve, especially in a TMR spin valve. In order to suppress or even eliminate unwanted effects on account of the migration of nitrogen, it has been found to be particularly advantageous to apply an outer layer comprising a nitrogen scavenger material to the antiferromagnetic stabilization layer of manganese nitride. The outer layer comprising nitrogen scavenger material may particularly advantageously be a layer comprising metallic or elemental tantalum, which is applied to the manganese nitride. The thickness of this tantalum layer may advantageously be matched to the thickness of the manganese-containing layer and to process parameters of the annealing process and of a sputtering process. Alternatively, the nitrogen scavenger material used in the outer layer may also be metallic or elemental titanium.

By way of illustration, an annealing process may be executed in order to enhance the exchange interaction or coupling (exchange bias effect) in the spin valve layer sequence. In the annealing process, there is a reduction in the nitrogen concentration in the stabilization layer.

Since, in illustrative working examples, the use of precious metal in the spin valve is avoided, the cost of production can be considerably reduced.

Particularly advantageously, in illustrative working examples, it is possible to use a top spin valve layer sequence in which the roughness of the stabilization layer which is then formed on the top side of the magnetic layers has no adverse effect on the functional ferromagnetic layers, e.g., on the first and second magnetic layers.

FIG. 1 shows a cross-sectional view of an apparatus 100 with a spin valve layer sequence 102 in tunnelling magneto resistance (TMR) configuration according to an illustrative working example. In other words, the spin valve layer sequence 102 according to FIG. 1 is an XMR layer sequence configured as a TMR layer sequence.

The spin valve layer sequence 102 shown in cross section is formed atop a substrate (not shown), atop which a seed layer 130 has been applied. The substrate may, for example, be a semiconductor substrate or a glass substrate. The spin valve layer sequence(s) 102 can be produced on a substrate in the form of a wafer, for example on a wafer having a diameter within a range of 150 mm to 300 mm.

Atop the seed layer 130 is formed a soft-magnetic first magnetic layer 104 with a variable, alterable or adjustable direction of magnetization. The first magnetic layer 104 is, for example, ferromagnetic CoFeB, the direction of magnetization of which can be reversed by an external magnetic field. In operation, the magnetization of the first magnetic layer 104 can be altered using an external magnetic field.

The spin valve layer sequence 102 additionally has an electrically insulating tunnel layer 112 formed atop the first magnetic layer 104. For example, the tunnel layer 112 may be formed from dielectric magnesium oxide. In a quantum-mechanical tunnelling effect, electrical charge carriers, regardless of the electrical insulation of the tunnel layer 112, can tunnel through it if a sufficient electrical voltage is applied. By way of illustration, the tunneling resistance of the tunnel layer 112 depends on the magnetization of the magnetic layers 104, 106 above and beneath the tunnel layer 112.

Atop the tunnel layer 112 is formed a second magnetic layer 106 having a fixed direction of magnetization. More specifically, the second magnetic layer 106 is formed from two ferromagnetic sublayers 116, 118, between which is disposed a coupling layer 120 for antiferromagnetic coupling of the two ferromagnetic sublayers 116, 118. The two ferromagnetic sublayers 116, 118 may each be formed, for example, from CoFeB. The coupling layer 120 may be formed from ruthenium, which serves to orient the spins in the two ferromagnetic sublayers 116, 118 antiparallel to one another, and to leave them in that orientation. While an external magnetic field in operation can influence the magnetization of the first magnetic layer 104 in a characteristic manner, the magnetization of the second magnetic layer 106 remains constant or unchanged even in the presence of an external magnetic field. In operating states with mutually parallel or antiparallel directions of magnetization of the magnetic layers 104, 106, the electrical resistance of the arrangement composed of the magnetic layers 104, 106 and the tunnel layer 112 disposed in between (or of the current conduction layer 114 according to FIG. 2) is different. By measuring the electrical resistance of the spin valve layer sequence 102, it is thus possible to measure the state of magnetization of the device 100.

Furthermore, a stabilization layer 108 for stabilizing the fixed direction of magnetization of the second magnetic layer 106 according to FIG. 1 is deposited directly atop the second magnetic layer 106. In an advantageous manner, the stabilization layer 108 includes a precious metal-free antiferromagnet, which may preferably be a nitride or an oxide of a transition metal. It is particularly preferable when the precious metal-free antiferromagnet includes or consists of manganese nitride. The antiferromagnetic manganese nitride may be in the $Mn_6N_{5+x}$ form, and where x is preferably within a range from 0.05 to 0.35 and is, for example, 0.18. Alternatively, or additionally, the manganese nitride may be in the $Mn_3N_2$ form, which likewise constitutes an antiferromagnetic phase of manganese nitride. Such manganese nitride may be produced in a simple manner by sputtering in a nitrogen atmosphere using a simple and inexpensive manganese target (cf. FIG. 3). Although manganese nitride produced by sputtering can have relatively high roughness, this is unproblematic in the case of the topspin valve configuration shown in FIG. 1, since the functionally critical magnetic layers 104, 106 have already been deposited beforehand and therefore remain unaffected even by a relatively high roughness of a manganese nitride stabilization layer 108. Therefore, it is highly advantageous for the quality of the spin valve layer sequence 102 that, according to FIG. 1, the stabilization layer 108 is disposed atop and above the second magnetic layer 106 and above the first magnetic layer 104.

Alternatively, the precious metal-free antiferromagnet may, for example, be nickel oxide.

The stabilization layer 108 may have a thickness D within a range from 10 nm to 50 nm. The exact thickness depends on the process parameters of the sputtering method (see FIG. 3) and a subsequent annealing method (see FIG. 4).

Likewise, advantageously, the spin valve layer sequence 102 according to FIG. 1 has an outer layer 110 having a thickness d within a range from 5 nm to 100 nm atop the stabilization layer 108. The outer layer 110 preferably includes a nitrogen scavenger material, which more preferably includes or consists of elemental tantalum and/or elemental titanium. In addition, the outer layer 110 has an antioxidation material, which especially protects the underlying magnetic layers 104, 106 from oxidation and corrosion. This has advantages: the nitrogen oxide scavenger material prevents nitrogen material introduced into the spin valve layer sequence 102 on sputtering from diffusing into adjacent layers, which can especially adversely affect the tunnel layer 112. Instead, such nitrogen material is bound within the nitrogen scavenger material of the outer layer 110 and is therefore prevented from diffusing into unwanted regions. Secondly, the antioxidation material in the outer layer 110 prevents unwanted oxidation or corrosion of the underlying layers of the spin valve layer sequence 102. For example, it is possible to incorporate a nitrogen-binding tantalum layer into antioxidation material of the outer layer 110.

In operation, the device 100 according to FIG. 1 may be subjected to a magnetic field that can influence the direction of magnetization of the first magnetic layer 104 having a variable direction of magnetization. Depending on whether the influencing leads to parallel or antiparallel magnetization of the magnetic layers 104, 106, the spin valve layer sequence 102 assumes different values of electrical resistance. If a current or a voltage is applied to the spin valve layer sequence 102, the electrical resistance value may be measured. The device 100 according to FIG. 1 may be used as a magnetic field sensor, reading head or current sensor. Use as a current sensor is possible since the electrical current to be measured in turn generates a magnetic field to which the device 100 reacts with a change in its electrical resistance. A device 100 in the form of a current sensor may be used, for example, to measure current in an engine management system. A device 100 in the form of a magnetic field sensor may be used, for example, to measure a magnetic field; for example, the angular position and the change therein for a steering rod may be measured using a magnetic angle sensor.

Alternatively, the device 100 may take the form of a data storage medium, e.g., of a MRAM (magnetoresistive random access memory) memory cell. The parallel or antiparallel states of magnetization of the magnetic layers 104, 106 may be assigned logic values of "0" or "1", which may be read out on account of the different electrical resistance in the two states. Such a memory cell may be written, for example, by applying a corresponding writing magnetic field. In order to form an MRAM memory, many devices 100 according to FIG. 1 may be assembled in columns and lines and may be addressed and read out, for example, using transistors.

Figure 2:
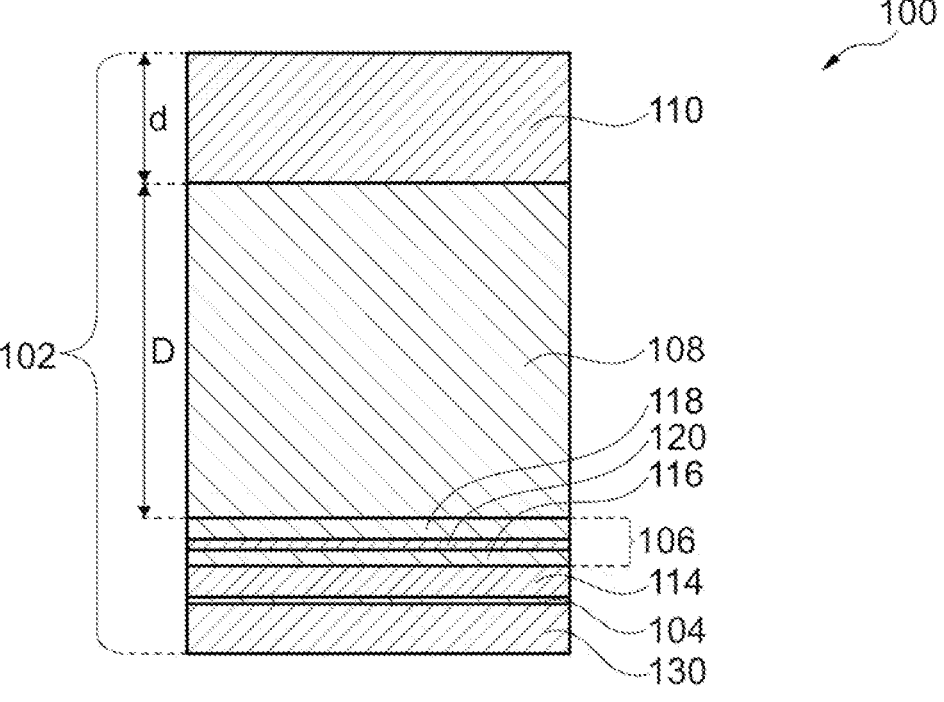
FIG. 2: a cross-sectional view of a device with a spin valve layer sequence according to another illustrative working example.

FIG. 2 shows a cross-sectional view of a device 100 with a spin valve layer sequence 102 in giant magneto resistance (GMR) configuration according to another illustrative working example. In other words, the spin valve layer sequence 102 is an XMR layer sequence configured in the special form of a GMR layer sequence.

Figure 3:
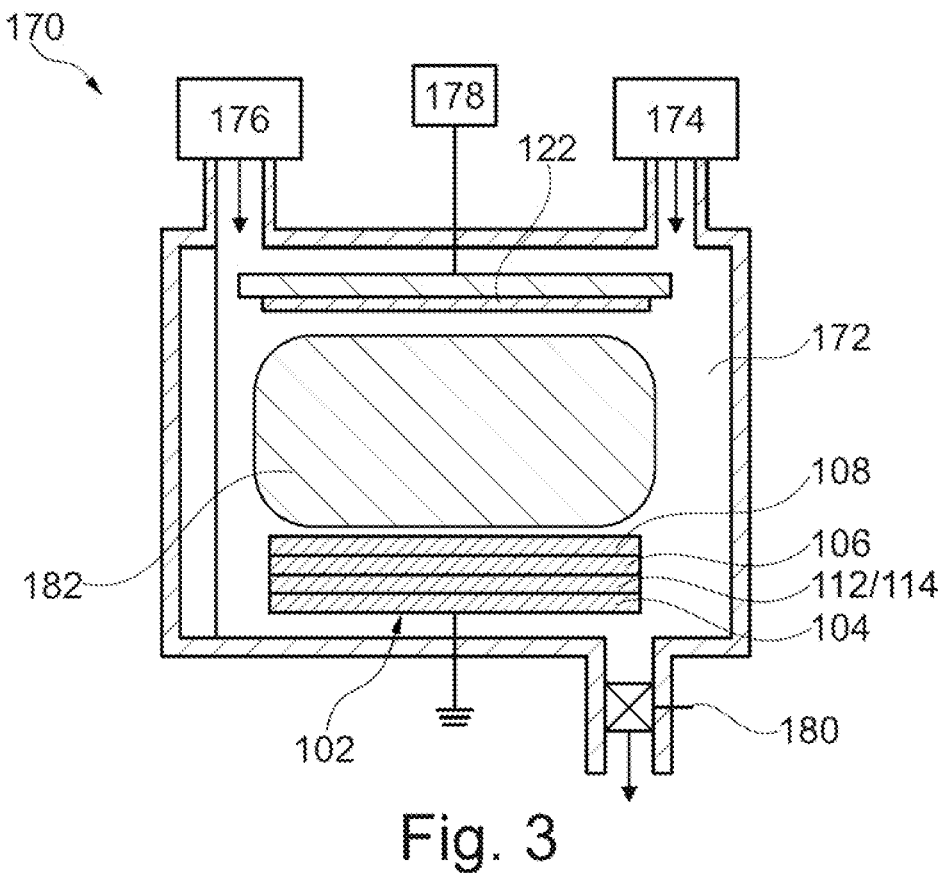
FIG. 3: part of an apparatus for production of a device with a spin valve layer sequence according to an illustrative working example.
Figure 4:
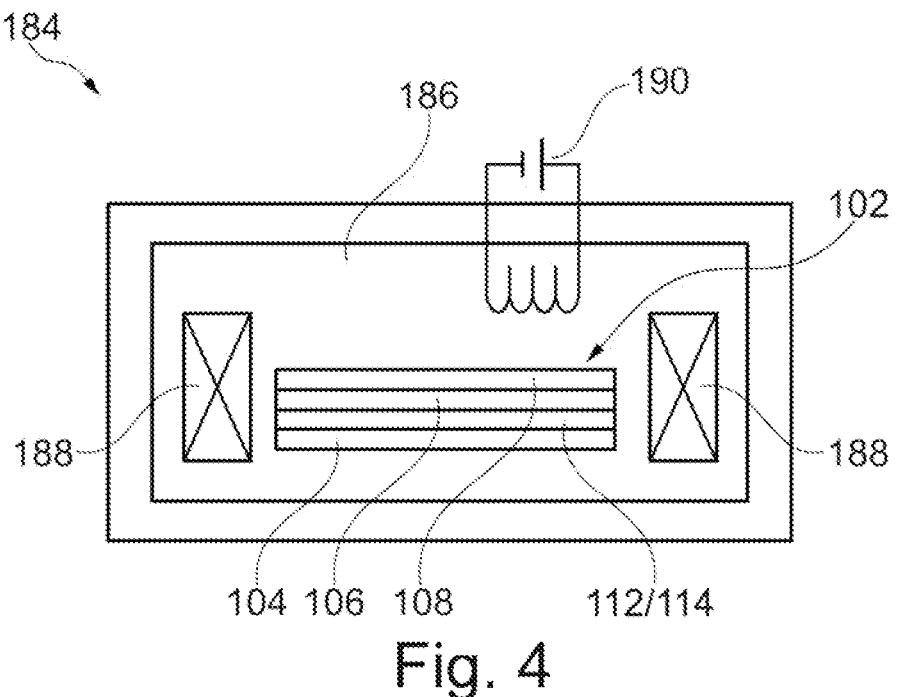
FIG. 4: another part of an apparatus for production of a device with a spin valve layer sequence according to an illustrative working example.

The device 100 according to FIG. 2 differs from the device 100 according to FIG. 1 essentially in that, according to FIG. 2, rather than the tunnel layer 112 (as discussed in FIG. 1), an electrically conductive current conduction layer 114 is disposed between the first magnetic layer 104 and the second magnetic layer 106. The electrically conductive current conduction layer 114 may be formed, for example, from copper or silver or another metallic material with low spin scatter.

a. FIG. 3 shows part of an apparatus for production of a device 100 with a spin valve layer sequence 102 according to an illustrative working example. FIG. 4 shows another part of an apparatus for production of a device 100 with a spin valve layer sequence 102 according to an illustrative working example.

More specifically, FIG. 3 shows a sputtering system 170, which is used especially for deposition of the stabilization layer 108. The sputtering system 170 shown in FIG. 3 may be configured to deposit a layer using DC magnetron sputtering. A corresponding spin valve layer sequence 102, as described in FIG. 1 and FIG. 2, has been introduced for this purpose into a process space 172 of the sputtering system 170. Reactive sputtering is effected (e.g., carried out) using a target 122 comprising a transition metal, especially made of manganese. The target 122 is therefore free of precious metals, such as iridium or platinum. It is possible to apply a high voltage to the target 122 using a high-voltage source 178. In addition, the sputtering according to FIG. 3 is effected (e.g., carried out) in a nitrogen-containing atmosphere. For this purpose, nitrogen from a nitrogen source 174 is introduced into the process space 172. Furthermore, a noble gas (as reaction gas, for example argon) from a noble gas source 176 is introduced into the process space 172. Medium which is no longer required can be removed from the process space 172 via a valve 180. In a manner known per se, the sputtering in the process space 172 forms a plasma 182 which, in the configuration described, leads to deposition of manganese nitride as stabilization layer 108 atop the second magnetic layer 106 of the spin valve layer sequence 102 being produced.

After the sputtering, the spin valve layer sequence 102 is removed from the process space 172 and introduced into an annealing apparatus 184, shown in FIG. 4.

In the annealing apparatus 184, there is healing or annealing of the stabilization layer 108 and of the magnetic layers 104, 106 disposed beneath using sputtering according to FIG. 3. For this purpose, the spin valve layer sequence 102 produced according to FIG. 3 is introduced into a process chamber 186, where the spin valve layer sequence 102 is subjected to a strong magnetic field (for example a magnetic field strength of 1 tesla) from an external magnet 188 (especially a permanent magnet or an electromagnet). Using a heating device 190, the spin valve layer sequence 102 may be heated during the annealing process, for example to a maximum temperature of 300° C. The process of healing or annealing comprises heating the spin valve layer sequence 102 including the stabilization layer 108 using a heating device 190, and subsequent cooling of the stabilization layer 108 in the external magnetic field generated by the external magnet 188. More specifically, it is possible to heat a whole wafer with spin valve layer sequence 102. The annealing process makes it possible to freeze the states of magnetization of the second magnetic layer 106 having a fixed direction of magnetization of the spin valve layer sequence 102.

Figures 5, 6:
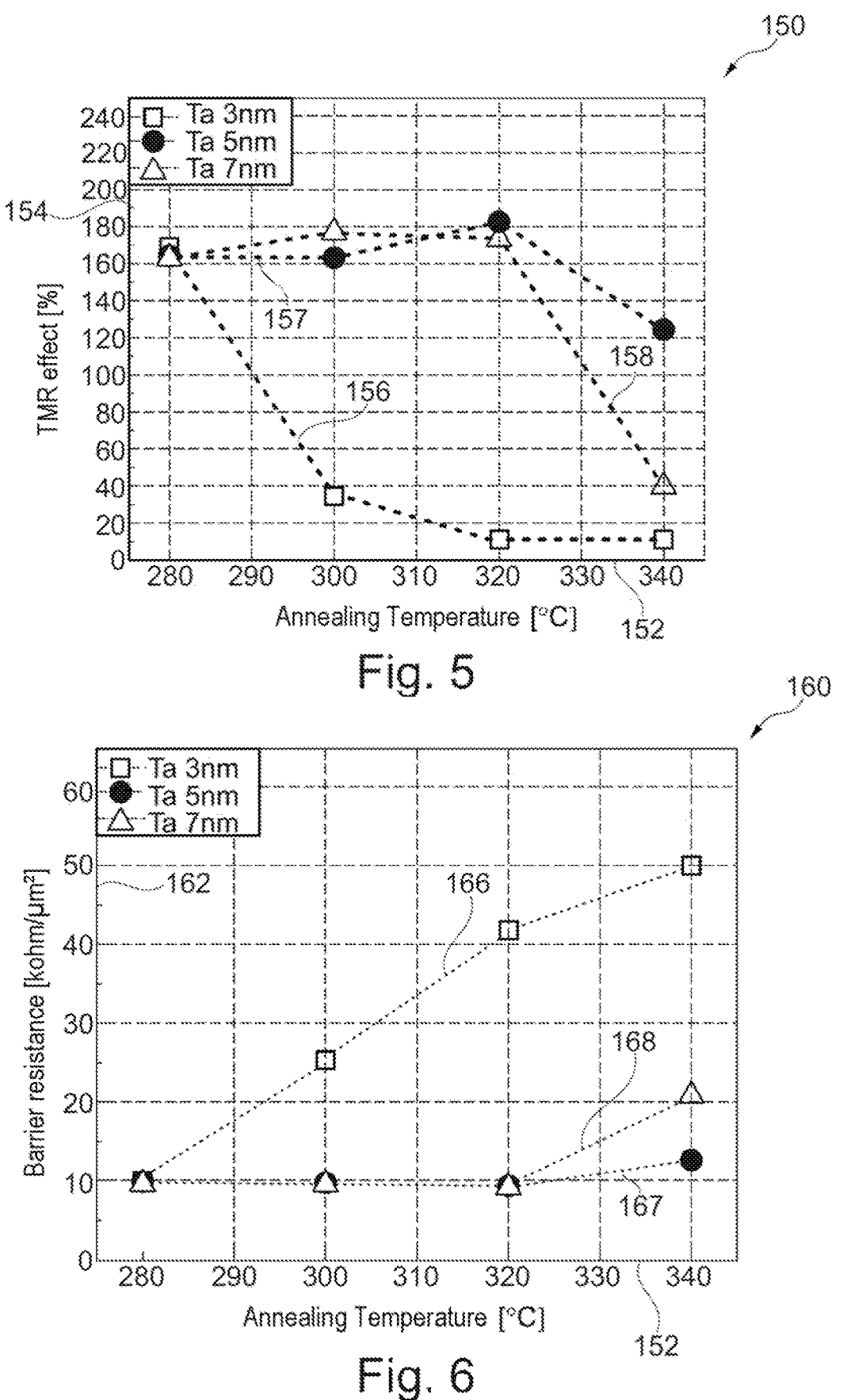
FIG. 5: a TMR swing versus annealing temperature for spin valve layer sequences with different tantalum thicknesses according to an illustrative working example
FIG. 6: a resistance versus annealing temperature for spin valve layer sequences with different tantalum thicknesses according to an illustrative working example

FIG. 5 shows a diagram 150 of the mode of function of a device 100 with a spin valve layer sequence 102 according to an illustrative working example. More specifically, FIG. 5 shows the TMR swing as a function of the thickness of the tantalum getter layer of the outer layer 110 and the annealing temperature. The diagram 150 has an abscissa 152 along which the temperature during the annealing according to FIG. 4 is shown. Along an ordinate 154 of the diagram 150 is shown a percentage of a TMR effect obtained, e.g., the TMR swing. By way of illustration, the value on the ordinate 154 indicates the strength of the TMR effect. The three curves 156, 157, 158 on the diagram 150 relate to different tantalum layer thicknesses (3 nm according to curve 156, 5 nm according to curve 157 and 7 nm according to curve 158) of a respective outer layer 110. The elemental tantalum serves as nitrogen scavenger material for scavenging superfluous nitrogen and for preventing diffusion of superfluous nitrogen into unwanted layers (for example into tunnel layer 112 according to FIG. 1). In the example of FIG. 5, the best results are obtained with a tantalum layer of thickness 5 nm.

The thickness of the tantalum layer affects what amount of nitrogen is absorbed in the annealing from the manganese nitride layer. If the tantalum layer chosen is too thick, too much nitrogen is trapped, and this trapped nitrogen is then absent in the manganese nitride. If the tantalum layer chosen is too thin, too little nitrogen is trapped, and nitrogen can migrate in an unwanted manner into adjacent layers. An optimal thickness of the tantalum layer may especially depend on how much nitrogen is present in the nitrogen atmosphere during the sputtering.

FIG. 6 shows a diagram 160 of the mode of function of a device 100 with a spin valve layer sequence 102 according to an illustrative working example. The diagram 160 has an abscissa 152 along which the temperature during the annealing according to FIG. 4 is shown. Along an ordinate 162 of the diagram 160 is shown an electrical resistance of a device 100 obtained. More specifically, the resistance is an area resistance, e.g., the resistance perpendicularly through the tunnel barrier. By way of illustration, the value on the ordinate 162 shows the TMR barrier resistance. The three curves 166, 167, 168 on the diagram 160 correspond to different thicknesses of the tantalum layer of 3 nm, 5 nm, and 7 nm, as already discussed in connection with FIG. 5. The 5 nm-thick tantalum layer thus leads firstly to the greatest magnetoresistive effect (curve 157 in FIG. 5) and additionally to the lowest resistance of the device according to curve 167 in FIG. 6.

Since, as described, the diffusion of the nitrogen for production of the manganese nitride should be controlled, the nitrogen content in the sputtering is crucial for the functionality of the spin valve. Especially the stoichiometry between the amount of nitrogen fed in in the sputtering operation and the thickness of the tantalum layer should therefore be adjusted appropriately. Thus, an excessively high nitrogen content can adversely affect the properties of the MgO tunnel barrier (see tunnel layer 112).

This phenomenon can advantageously be suppressed in that the tantalum-containing outer layer 110 functions as nitrogen scavenger. The thickness of the tantalum-containing cap can therefore advantageously be matched to the MnN sputtering process, to the MnN thickness and to the process parameters of the annealing.

It should additionally be pointed out that "including" does not preclude any other elements or steps, and "a" does not preclude a multitude. Moreover, it should be pointed out that features or steps that have been described with reference to one of the above working examples may also be used in combination with other features or steps of other above-described working examples. Reference numerals in the claims should not be considered to be a restriction.

The invention claimed is:

1. A device having a spin valve layer sequence, wherein the spin valve layer sequence includes:
    a first magnetic layer having a variable direction of magnetization;
    a second magnetic layer having a fixed direction of magnetization; and
    a stabilization layer for stabilizing the fixed direction of magnetization of the second magnetic layer,
    wherein the stabilization layer includes a precious metal-free antiferromagnet, and
    wherein the stabilization layer is disposed above the second magnetic layer and above the first magnetic layer.

2. The device as claimed in claim 1, wherein the precious metal-free antiferromagnet is a nitride of a transition metal or an oxide of a transition metal.

3. The device as claimed in claim 1, wherein the precious metal-free antiferromagnet includes manganese nitride.

4. The device as claimed in claim 3, wherein the manganese nitride is in a form of $Mn_6N_{5+x}$, where x is within a range from 0 to 1 or within a range from 0.05 to 0.35; or wherein the manganese nitride is in a form of $Mn_3N_2$.

5. The device as claimed in claim 1, wherein the stabilization layer has a thickness within a range from 10 nm to 50 nm.

6. A device having a spin valve layer sequence, wherein the spin valve layer sequence includes:

a first magnetic layer having a variable direction of magnetization;

a second magnetic layer having a fixed direction of magnetization; and a stabilization layer for stabilizing the fixed direction of magnetization of the second magnetic layer, wherein the stabilization layer includes a precious metal-free antiferromagnet, and wherein the second magnetic layer has two ferromagnetic sublayers, between which is disposed a coupling layer for antiferromagnetic coupling of the two ferromagnetic sublayers.

7. The device as claimed in claim 1, further comprising an outer layer atop the stabilization layer.

8. The device as claimed in claim 7, wherein the outer layer includes a nitrogen scavenger material.

9. The device as claimed in claim 8, wherein the nitrogen scavenger material comprises at least one of an elemental tantalum or an elemental titanium.

10. The device as claimed in claim 7, wherein the outer layer includes an antioxidation material.

11. The device as claimed in claim 7, wherein the outer layer has a thickness within a range from 5 nm to 100 nm.

12. The device as claimed in claim 1, further comprising:

an electrically insulating tunnel layer between the first magnetic layer and the second magnetic layer; or an electrically conductive current conduction layer between the first magnetic layer and the second magnetic layer.

13. The device as claimed in claim 6, wherein the stabilization layer is disposed above the second magnetic layer and above the first magnetic layer.

14. The device as claimed in claim 1, wherein the first magnetic layer is a soft-magnetic layer.

15. The device as claimed in claim 1, wherein the spin valve layer sequence is a magnetoresistive layer sequence having a magnetoresistive effect.

16. A device, comprising:

a spin valve layer sequence, wherein the spin valve layer sequence includes a stabilization layer configured to stabilize a fixed direction of magnetization of a magnetic layer, wherein the magnetic layer includes two ferromagnetic sublayers, between which is disposed a coupling layer for antiferromagnetic coupling of the two ferromagnetic sublayers, wherein the stabilization layer is directly coupled to the magnetic layer, and wherein the stabilization layer contains or consists of manganese nitride.

17. A method of producing a device having a spin valve layer sequence, wherein the method comprises:

forming a first magnetic layer of the spin valve layer sequence, the first magnetic layer having a variable direction of magnetization;

forming a second magnetic layer of the spin valve layer sequence, the second magnetic layer having a fixed direction of magnetization; and forming a stabilization layer of the spin valve layer sequence, the stabilization layer configured to stabilize the fixed direction of magnetization of the second magnetic layer, wherein the stabilization layer is a precious metal-free antiferromagnet, wherein the stabilization layer is disposed above the second magnetic layer and above the first magnetic layer.

18. The method as claimed in claim 17, wherein the method includes forming of the stabilization layer by sputtering.

19. The method as claimed in claim 18, wherein the method includes sputtering using a target made of a transition metal.

20. The method as claimed in claim 18, wherein the method includes sputtering in a nitrogen-containing atmosphere or an oxygen-containing atmosphere.

21. The method as claimed in claim 17, wherein the method includes annealing of the stabilization layer once formed.

22. The method as claimed in claim 21, wherein the annealing includes heating of the stabilization layer and, subsequent to heating of the stabilization layer, cooling of the stabilization layer in an external magnetic field.

23. The device of claim 16, wherein the manganese nitride is in a form of $Mn_6N_{5+x}$, where x is within a range from 0 to 1 or within a range from 0.05 to 0.35; or wherein the manganese nitride is in a form of $Mn_3N_2$.

* * * * *